United States Patent
Fukuda et al.

(10) Patent No.: US 9,768,233 B1
(45) Date of Patent: Sep. 19, 2017

(54) SEMICONDUCTOR DEVICE AND METHOD OF MANUFACTURING THE SAME

(71) Applicant: TOSHIBA MEMORY CORPORATION, Minato-ku, Tokyo (JP)

(72) Inventors: Natsuki Fukuda, Mie (JP); Mutsumi Okajima, Mie (JP); Atsushi Oga, Mie (JP); Toshiharu Tanaka, Mie (JP); Takeshi Yamaguchi, Mie (JP); Takeshi Takagi, Mie (JP); Masanori Komura, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/074,338

(22) Filed: Mar. 18, 2016

Related U.S. Application Data

(60) Provisional application No. 62/301,903, filed on Mar. 1, 2016.

(51) Int. Cl.
| | | |
|---|---|---|
| *H01L 27/15* | (2006.01) | |
| *H01L 23/528* | (2006.01) | |
| *H01L 29/792* | (2006.01) | |
| *H01L 21/768* | (2006.01) | |
| *H01L 27/24* | (2006.01) | |
| *H01L 21/3213* | (2006.01) | |
| *H01L 21/311* | (2006.01) | |
| *H01L 27/11575* | (2017.01) | |

(Continued)

(52) U.S. Cl.
CPC ........ *H01L 27/2481* (2013.01); *H01L 21/311* (2013.01); *H01L 21/3213* (2013.01); *H01L 21/76805* (2013.01); *H01L 21/76816* (2013.01); *H01L 21/8221* (2013.01); *H01L 27/1157* (2013.01); *H01L 27/11551* (2013.01); *H01L 27/11556* (2013.01); *H01L 27/11573* (2013.01); *H01L 27/11575* (2013.01); *H01L 27/11578* (2013.01); *H01L 27/11582* (2013.01); *H01L 29/7926* (2013.01)

(58) Field of Classification Search
CPC ......... H01L 27/11582; H01L 27/11578; H01L 27/11575; H01L 27/11556; H01L 27/11573; H01L 27/1157; H01L 27/11551; H01L 29/7926; H01L 21/8221
See application file for complete search history.

(56) References Cited

U.S. PATENT DOCUMENTS

| | | |
|---|---|---|
| 8,648,467 B2 | 2/2014 | Baba |
| 8,803,214 B2 | 8/2014 | Tang et al. |

(Continued)

*Primary Examiner* — Marvin Payen
*Assistant Examiner* — Jeremy Joy
(74) *Attorney, Agent, or Firm* — Foley & Lardner LLP

(57) ABSTRACT

A semiconductor device according to an embodiment includes: a stacked body including a plurality of first conductive films stacked via an inter-layer insulating film; a first conductive body facing the stacked body to extend in a stacking direction; and a plurality of first insulating films in the same layers as the first conductive films and disposed between the first conductive body and the first conductive films, the first conductive body including a projecting part that projects along tops of one of the first insulating films and one of the first conductive films, and a lower surface of the projecting part contacting an upper surface of the one of the first conductive films.

11 Claims, 14 Drawing Sheets

(51) Int. Cl.
*H01L 27/11573* (2017.01)
*H01L 21/822* (2006.01)
*H01L 27/11578* (2017.01)
*H01L 27/11556* (2017.01)
*H01L 27/11582* (2017.01)
*H01L 27/11551* (2017.01)
*H01L 27/1157* (2017.01)

(56) References Cited

U.S. PATENT DOCUMENTS

| | | |
|---|---|---|
| 8,896,051 B2 | 11/2014 | Nansei |
| 9,076,502 B2 | 7/2015 | Nakajima |
| 9,099,177 B2 | 8/2015 | Sasago et al. |
| 2009/0020744 A1* | 1/2009 | Mizukami ......... H01L 27/11578 257/4 |
| 2012/0025386 A1* | 2/2012 | Murata ............... H01L 27/2409 257/770 |
| 2012/0299189 A1* | 11/2012 | Nakajima ......... H01L 21/76895 257/773 |
| 2013/0228848 A1* | 9/2013 | Nansei ................ H01L 27/1157 257/324 |
| 2015/0069499 A1* | 3/2015 | Nakaki ............. H01L 27/11582 257/326 |

\* cited by examiner

SEMICONDUCTOR DEVICE AND METHOD OF MANUFACTURING THE SAME

CROSS-REFERENCE TO RELATED APPLICATIONS

This application is based upon and claims the benefit of priority from the prior U.S. Provisional Application 62/301,903, filed on Mar. 1, 2016, the entire contents of which are incorporated herein by reference.

BACKGROUND

Field

Embodiments of the present invention relate to a semiconductor device and a method of manufacturing the same.

Description of the Related Art

A flash memory is a semiconductor device known for its low cost and large capacity. One example of a semiconductor device to replace the flash memory is a variable resistance type memory (ReRAM: Resistance RAM) which employs a variable resistance film in its memory cell. The ReRAM can configure a cross-point type memory cell array, hence can achieve an increased capacity similarly to the flash memory. Moreover, in order to further increase capacity, there is also being developed a ReRAM having a so-called VBL (Vertical Bit Line) structure in which bit lines which are selection wiring lines are arranged in a perpendicular direction to a semiconductor substrate.

DETAILED DESCRIPTION

A semiconductor device according to an embodiment including: a stacked body including a plurality of first conductive films stacked via an inter-layer insulating film; a first conductive body facing the stacked body to extend in a stacking direction; and a plurality of first insulating films in the same layers as the first conductive films and disposed between the first conductive body and the first conductive films, the first conductive body including a projecting part that projects along tops of one of the first insulating films and one of the first conductive films, and a lower surface of the projecting part contacting an upper surface of the one of the first conductive films.

Semiconductor devices and methods of manufacturing the same according to embodiments will be described below with reference to the drawings.

First Embodiment

First, an overall configuration of a semiconductor device according to a first embodiment will be described. Note that hereafter, a semiconductor device of three-dimensional structure employing a memory cell including a variable resistance element will be described as an example. However, all of the embodiments described hereafter may be applied also to another semiconductor device having a three-dimensional structure, including the case where a memory cell including a charge accumulation film is employed, and so on.

Figure 1:
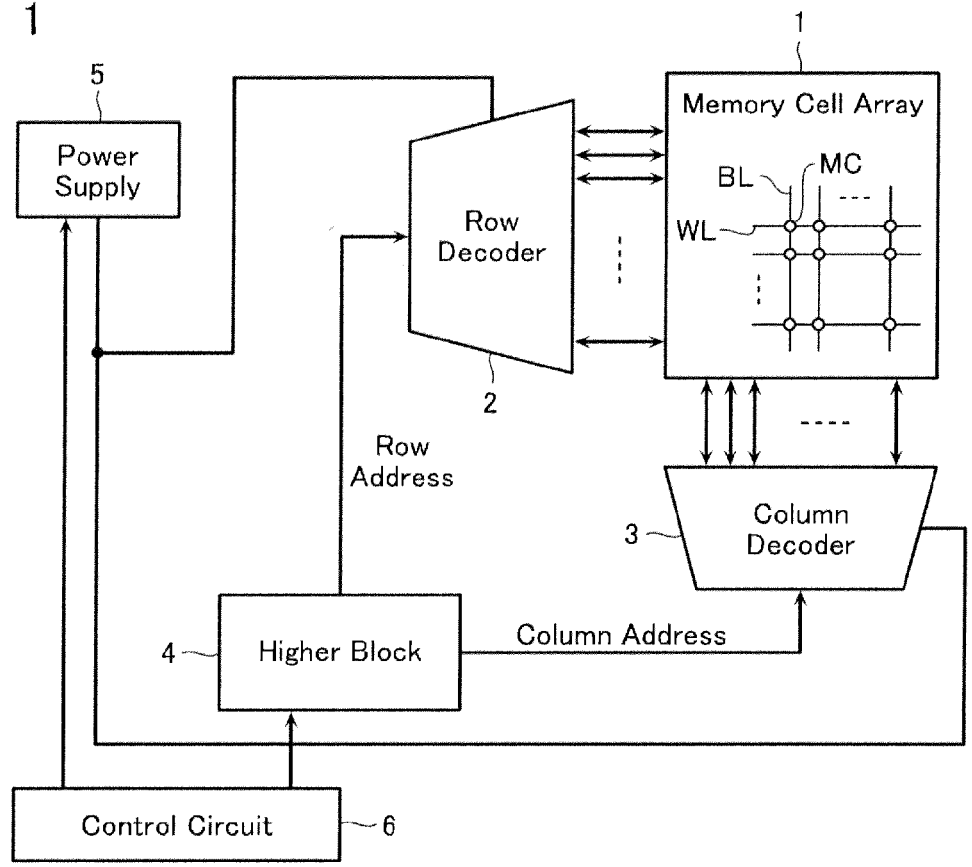
FIG. 1 is a view showing functional blocks of a semiconductor device according to a first embodiment.

FIG. 1 is a view showing functional blocks of the semiconductor device according to the present embodiment.

As shown in, FIG. 1, the semiconductor device of the present embodiment comprises: a memory cell array 1; a row decoder 2; a column decoder 3; a higher block 4; a power supply 5; and a control circuit 6.

The memory cell array 1 includes: a plurality of word lines WL (conductive films) and a plurality of bit lines BL (conductive films) that intersect each other; and a plurality of memory cells MC disposed at intersections of these word lines WL and bit lines BL. The row decoder 2 selects the word line WL during an access operation. The column decoder 3 selects the bit line BL during an access operation, and includes a driver that controls the access operation. The higher block 4 selects the memory cell MC which is to be an access target in the memory cell array 1. The higher block 4 provides a row address and a column address to, respectively, the row decoder 2 and the column decoder 3. The power supply 5, during write/read of data, generates certain combinations of voltages corresponding to respective operations, and supplies these combinations of voltages to the row decoder 2 and the column decoder 3. The control circuit 6 performs control of the likes of sending the addresses to the higher block 4, and, moreover, performs control of the power supply 5, based on a command from external.

Hereafter, the memory cell array 1 will be described.

Figure 2:
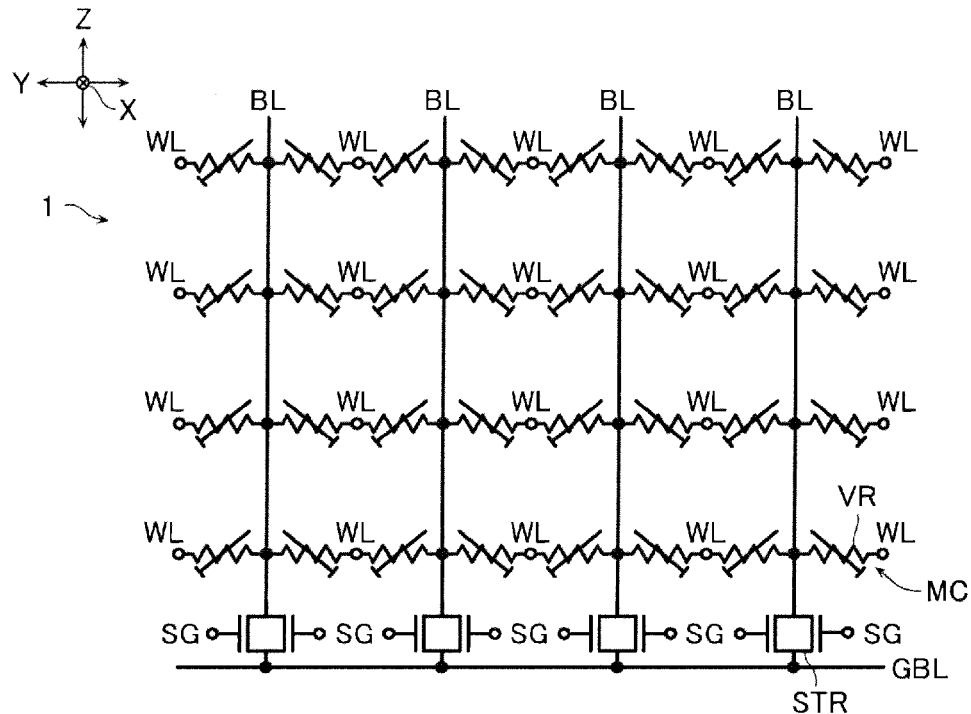
FIG. 2 is a circuit diagram of a memory cell array of the semiconductor device according to the same embodiment.
Figure 3:
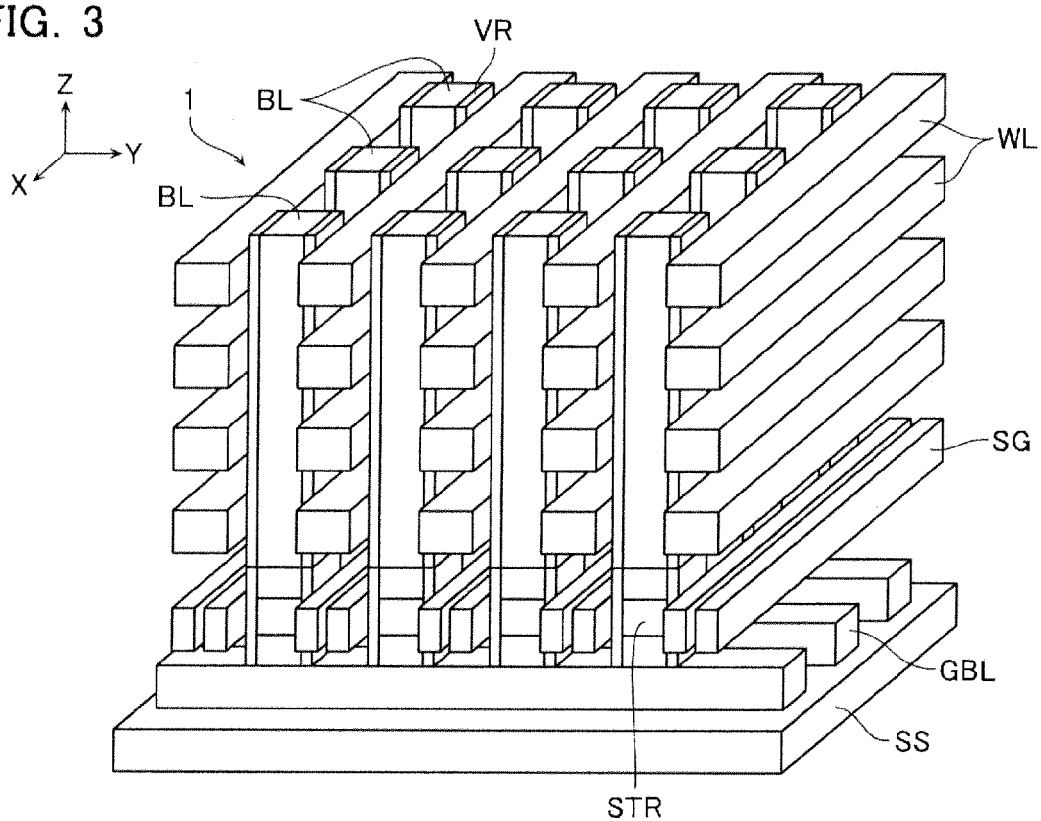
FIG. 3 is a schematic perspective view of the memory cell array of the semiconductor device according to the same embodiment.

FIG. 2 is a circuit diagram of the memory cell array of the semiconductor device according to the present embodiment; and FIG. 3 is a schematic perspective view of the memory cell array of the same semiconductor device.

As shown in FIG. 2, the memory cell array 1 includes a select transistor STR, a global bit line GBL, and a select gate line SG, in addition to the previously mentioned word line WL, bit line BL, and memory cell MC.

As shown in FIG. 3, the memory cell array 1 has a so-called VBL (Vertical Bit Line) structure in which the bit line BL extends perpendicularly to a principal plane of a semiconductor substrate SS. In other words, the word lines WL are arranged in a matrix in a Y direction and a Z direction (stacking direction), and extend in an X direction. The bit lines BL are arranged in a matrix in the X direction and the Y direction, and extend in the Z direction. Moreover, the memory cell MC is disposed at an intersection of the word line WL and the bit line BL. Due to the above, the memory cells MC are arranged in a three-dimensional matrix in the X direction, the Y direction, and the Z direction.

As shown in FIG. 2, the memory cell MC includes a variable resistance element VR. The variable resistance element VR undergoes transition between a high-resistance state and a low-resistance state, based on an applied voltage. The memory cell MC stores data in a nonvolatile manner by a resistance state of this variable resistance element VR. The variable resistance element VR generally has: a setting operation where it undergoes transition from the high-resistance state (reset state) to the low-resistance state (set state); and a resetting operation where it undergoes transition from the low-resistance state (set state) to the high-resistance state (reset state). In addition, the variable resistance element VR has a forming operation required only immediately after manufacturing. This forming operation is an operation in which a region (filament path) where locally it is easy for a current to flow is formed in the variable resistance element VR. The forming operation is executed by applying to both ends of the variable resistance element VR a voltage which is higher than an applied voltage employed during the setting operation and the resetting operation.

The select transistor STR is disposed between the global bit line GBL and a lower end of the bit line BL. As shown in FIG. 3, the global bit lines GBL are arranged in the X direction, and extend in the Y direction. Each of the global bit lines GEL is commonly connected to one ends of a plurality of the select transistors STR arranged in the Y direction.

The select transistor STR is controlled by the select gate line SG functioning as a gate. The select gate lines SG are arranged in the Y direction, and extend in the X direction. A plurality of the select transistors STR arranged in the X direction are collectively controlled by one select gate line SG functioning as gates of these select transistors STR. On the other hand, in the case of FIG. 3, a plurality of the select transistors STR arranged in the Y direction are independently controlled by separately provided select gate lines SG.

Next, a connection structure of the memory cell array 1 and a peripheral circuit on the semiconductor substrate will be described exemplifying a connection structure of the word line WL and the peripheral circuit. Hereafter, a region where a connection wiring line with the peripheral circuit is disposed, of the memory cell array 1 will be called a "contact region 1b". Note that hereafter, description is made using an example where the memory cell array 1 has word lines WL<0> to WL<3>, but the embodiments described hereafter are not limited to this.

Figure 4:
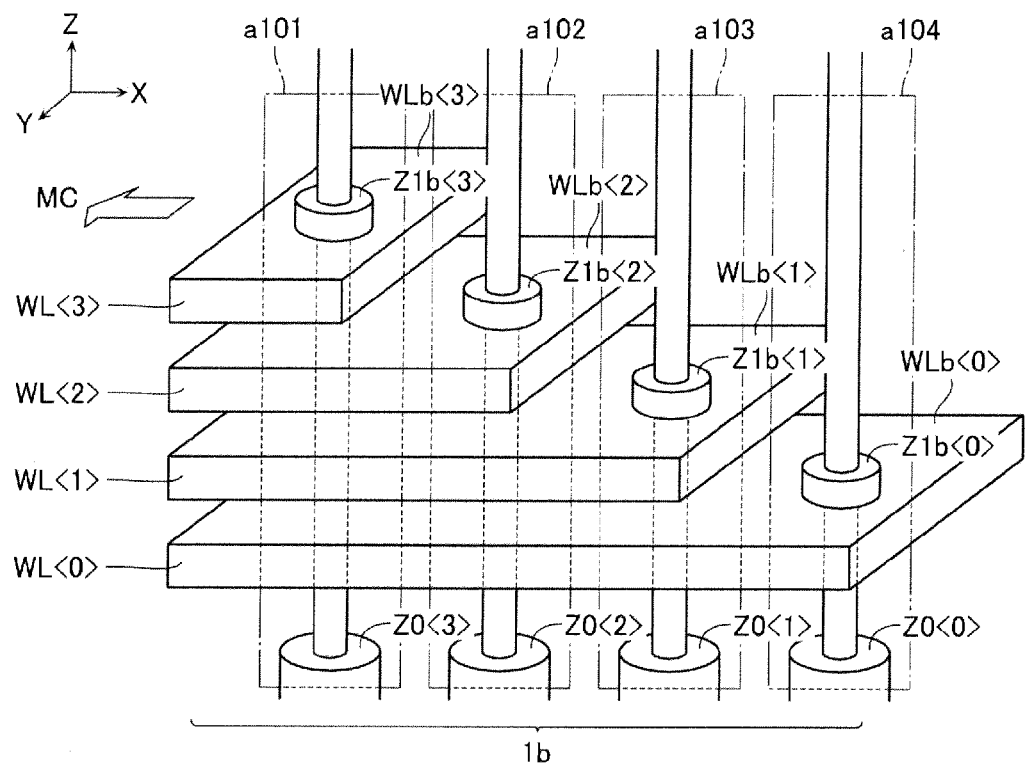
FIG. 4 is a perspective view showing a schematic structure of a contact region of the memory cell array of the semiconductor device according to the same embodiment.

FIG. 4 is a perspective view showing a schematic structure of the contact region of the memory cell array of the semiconductor device according to the present embodiment.

As shown in FIG. 4, each of the word lines WL<i> (i=0 to 3) connected to the memory cell MC is electrically connected to the peripheral circuit (not illustrated) disposed on the semiconductor substrate, via two vias Z1<i> (conductive body) and Z0<i> (conductive film). Each of the word lines WL<i> has a contact portion WLb<i> for contacting with the via Z1<i>, in the contact region 1b. Each of the vias Z1<i> is formed so as to extend in the Z direction and penetrate the contact portion WLb<i>. Formed in each of the vias Z1<i>, on at least both side surfaces facing in the X direction, is a projecting part Z1b<i> that projects. The via Z1<i> contacts the word line WL<i> by a bottom surface which is one of side surfaces of this projecting part Z1b<i> contacting an upper surface of the contact portion WLb<i>. On the other hand, each of the vias Z0<i> is disposed between the semiconductor substrate and the lowermost layer word line WL<0>, and is electrically connected to the peripheral circuit at a bottom surface of the via Z0<i>. Moreover, the word line WL<i> and the peripheral circuit are electrically connected by a bottom surface of the via Z1<i> and an upper surface of the via Z0<i> being in contact. Now, each of the word lines WL<i> is stacked in the Z direction, hence when disposing the via Z1<i>, care must be taken about interference between the via Z1<i> and the word line WL<j> (j=0 to 3, excluding i) other than the word line WL<i>.

In this respect, in the present embodiment, the contact portion WLb<i> of the word line WL<i> is formed at a position projected from an arrangement region of the word line WL<u> (u=i to 3) in a higher layer than the word line WL<i>. In the case of the example of FIG. 4, ends of the word lines WL stacked in the Z direction are formed in a stepped shape, and a portion corresponding to a step of the stepped shape functions as the contact portion WLb. As a result, interference between the via Z1<i> and the higher layer word line WL<u> can be avoided.

However, interference between the via Z1<i> and the word line WL<l> (l=0 to i−1) cannot be avoided by this alone.

Therefore, in the present embodiment, the connection structure of the word line WL and the peripheral circuit is further configured as follows.

Figure 5:
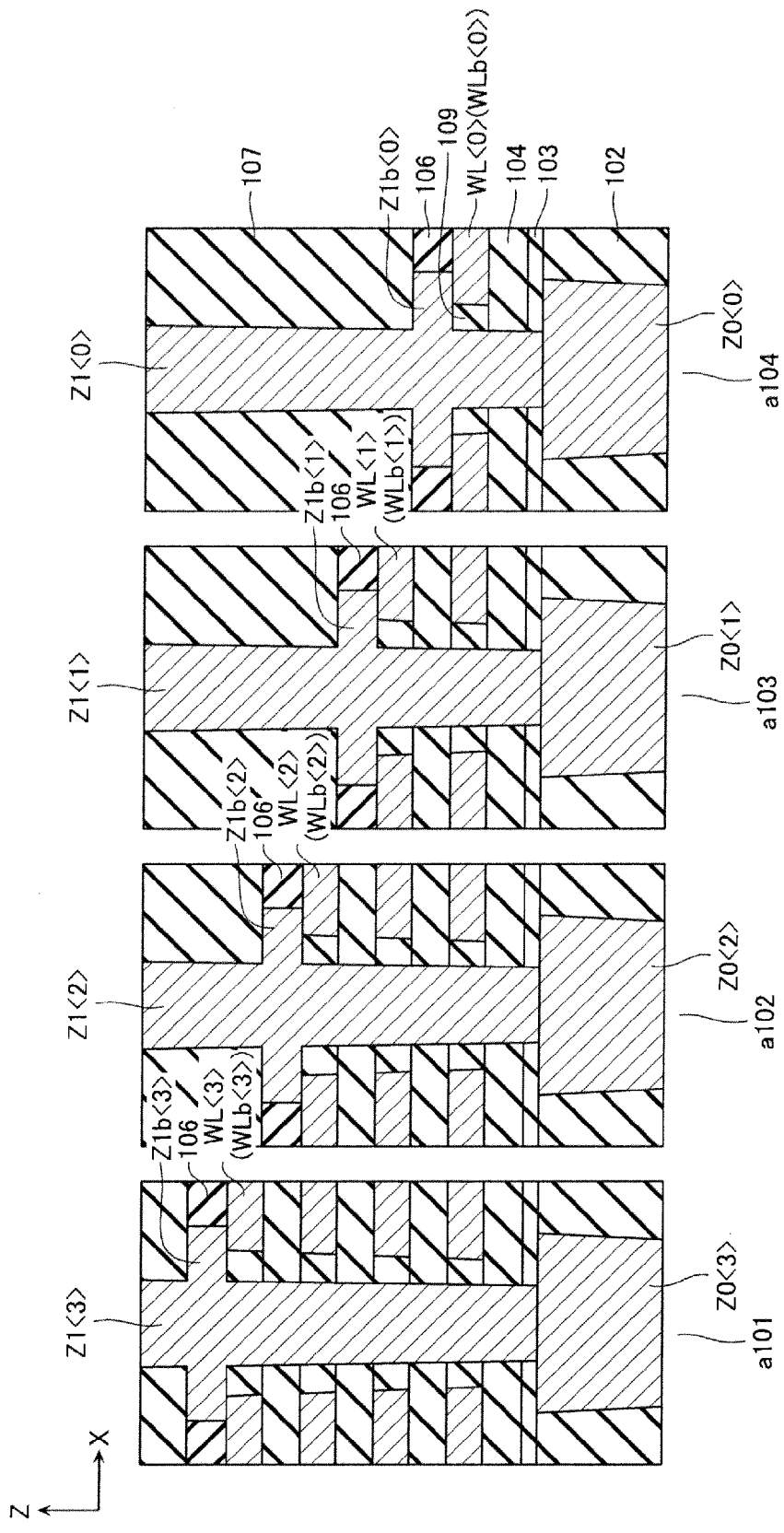
FIG. 5 is a cross-sectional view of the contact region of the memory cell array of the semiconductor device according to the same embodiment.

FIG. 5 is a cross-sectional view of the contact region of the memory cell array of the semiconductor device according to the present embodiment. FIG. 5 is a cross-sectional view of ranges a101 to a104 indicated by the dot-chain lines and broken lines shown in FIG. 4.

The memory cell array 1 includes: the via Z0; an inter-layer insulating film 102 that insulates between the vias Z0 adjacent in the X direction; an etching stop film 103 disposed on the via Z0 and the inter-layer insulating film 102; an inter-layer insulating film 104 and the word line WL disposed alternately on the etching stop film 103; an inter-layer insulating film 106 disposed on the uppermost layer word line WL<i> (i=0 to 3) in each of places (positions indicated by the ranges a101 to a104) viewed from the Z direction; and an inter-layer insulating film 107 disposed on the inter-layer insulating film 106. Now, the via Z0 is formed from titanium nitride (TiN), for example. The inter-layer insulating films 102, 104, and 107 are formed from silicon oxide ($SiO_2$), for example. The etching stop film 103 is formed from a metal oxide, for example. The word line WL is formed from titanium nitride (TiN), for example. The inter-layer insulating film 106 is formed by a material different from that of the inter-layer insulating films 104 and 107, and is formed from silicon nitride (SiN), for example.

In addition, the memory cell array 1 includes the via Z1<i> that extends in the Z direction and reaches at least from an upper surface of the inter-layer insulating film 106 to a bottom surface of the word line WL<i>. In the case of FIG. 5, the via Z1<i> reaches from an upper surface of the inter-layer insulating film 107 to an upper surface of the via Z0<i>. The via Z1<i> penetrates the contact portion WLb<i> of the word line WL<i> that the via Z1<i> contacts. Side surfaces of each of the vias Z1<i> and side surfaces of the word lines WL<0> to WL<i> have an insulating film 109 disposed between them, and the two are not in contact. The insulating film 109 is formed by a material different from that of the inter-layer insulating film 106, and is formed from silicon oxide ($SiO_2$), for example. In addition, each of the vias Z1<i> has the projecting part Z1b<i> that projects on both sides in the X direction at the same height as the inter-layer insulating film 106. This projecting part Z1b<i> has a width that exceeds the insulating film 109 to reach the contact portion WLb<i> in the X direction, and a bottom surface of the projecting part Z1b<i> contacts the contact portion WLb<i> and the insulating film 109. In other words, due to the above-described connection structure of the contact region 1b of the memory cell array 1, the via Z1<i> contacts the word line WL<i> while being insulated from the word line WL<l> in a lower layer.

Next, manufacturing steps of the contact region 1b of the memory cell array 1 will be described.

FIGS. 6 to 13 are cross-sectional views describing the manufacturing steps of the contact region of the memory cell array of the semiconductor device according to the present embodiment.

Figure 6:
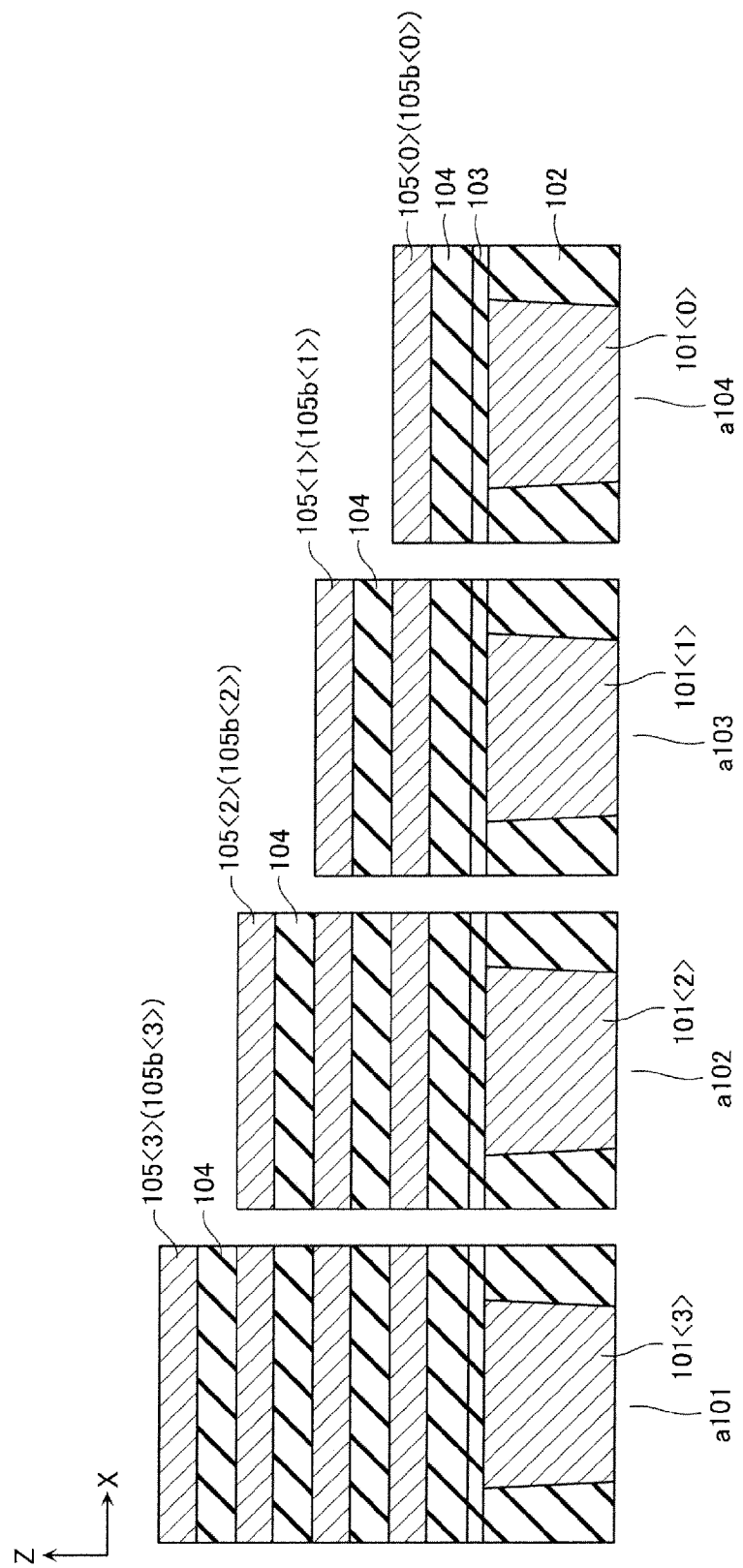
FIGS. 6 to 13 are cross-sectional views describing manufacturing steps of the contact region of the memory cell array of the semiconductor device according to the same embodiment.

First, the etching stop film 103 is deposited on each of the conductive films 101<i> (i=0 to 3) and the inter-layer insulating film 102. Each of the conductive films 101<i> is formed by titanium nitride (TiN), for example, and functions as the via Z0<i>. The etching stop film 103 is formed by a metal oxide, for example, and will be a film for suppressing over-etching of the conductive film 101 during formation of a hole 122 in a later step. Next, a plurality of the inter-layer insulating films 104 and conductive films 105 are stacked alternately on the etching stop film 103. Now, the inter-layer insulating film 104 is formed by silicon oxide ($SiO_2$), for example. The conductive film 105 is formed from titanium nitride (TiN), for example, and functions as the word line WL. Next, as shown in FIG. 6, the conductive films 105 are formed in a stepped shape in the contact region 1b of the memory cell array 1. As a result, a contact portion 105b<i> is formed in each of the conductive films 105<i>.

Figure 7:
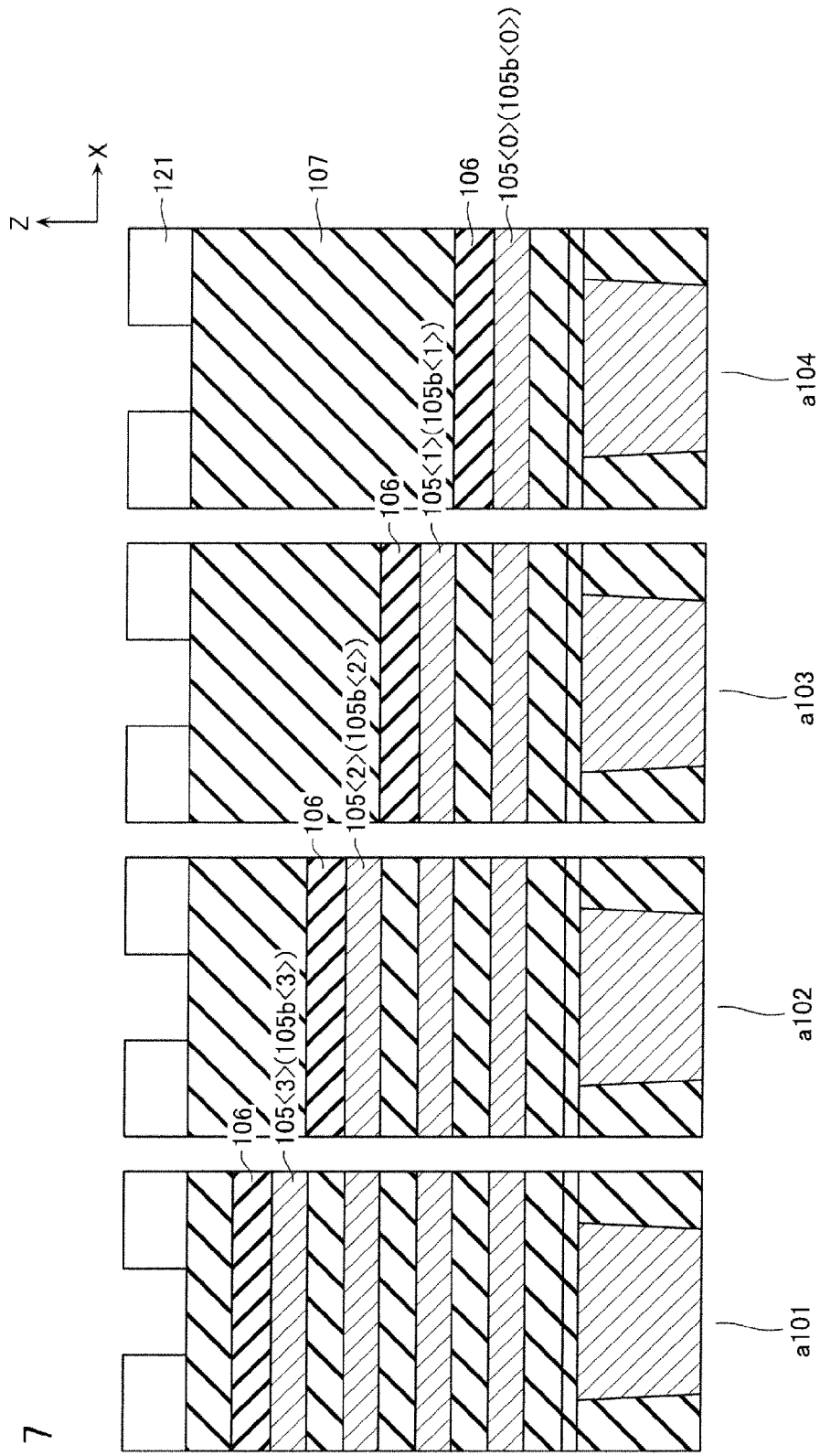

Next, the inter-layer insulating film 106 is deposited on a stacked conductive film configured from the conductive films 101<0> to 101<3>. This inter-layer insulating film 106 contacts each of the contact portions 105b<i>. The inter-layer insulating film 106 is formed by a material allowing an etching selectivity ratio to be taken with respect to materials of the inter-layer insulating film 104 and the inter-layer insulating film 107 and insulating film 109 formed in a later step. When the inter-layer insulating films 104 and 107 and the insulating film 109 are formed by silicon oxide ($SiO_2$), the inter-layer insulating film 106 is formed by silicon nitride (SiN), for example. Next, the inter-layer insulating film 107 is deposited on top of the inter-layer insulating film 106. Now, the inter-layer insulating film 107 is formed by silicon oxide ($SiO_2$), for example. Next, as shown in FIG. 7, a resist film 121 having a pattern of the via Z1 is deposited on the inter-layer insulating film 107.

Figure 8:
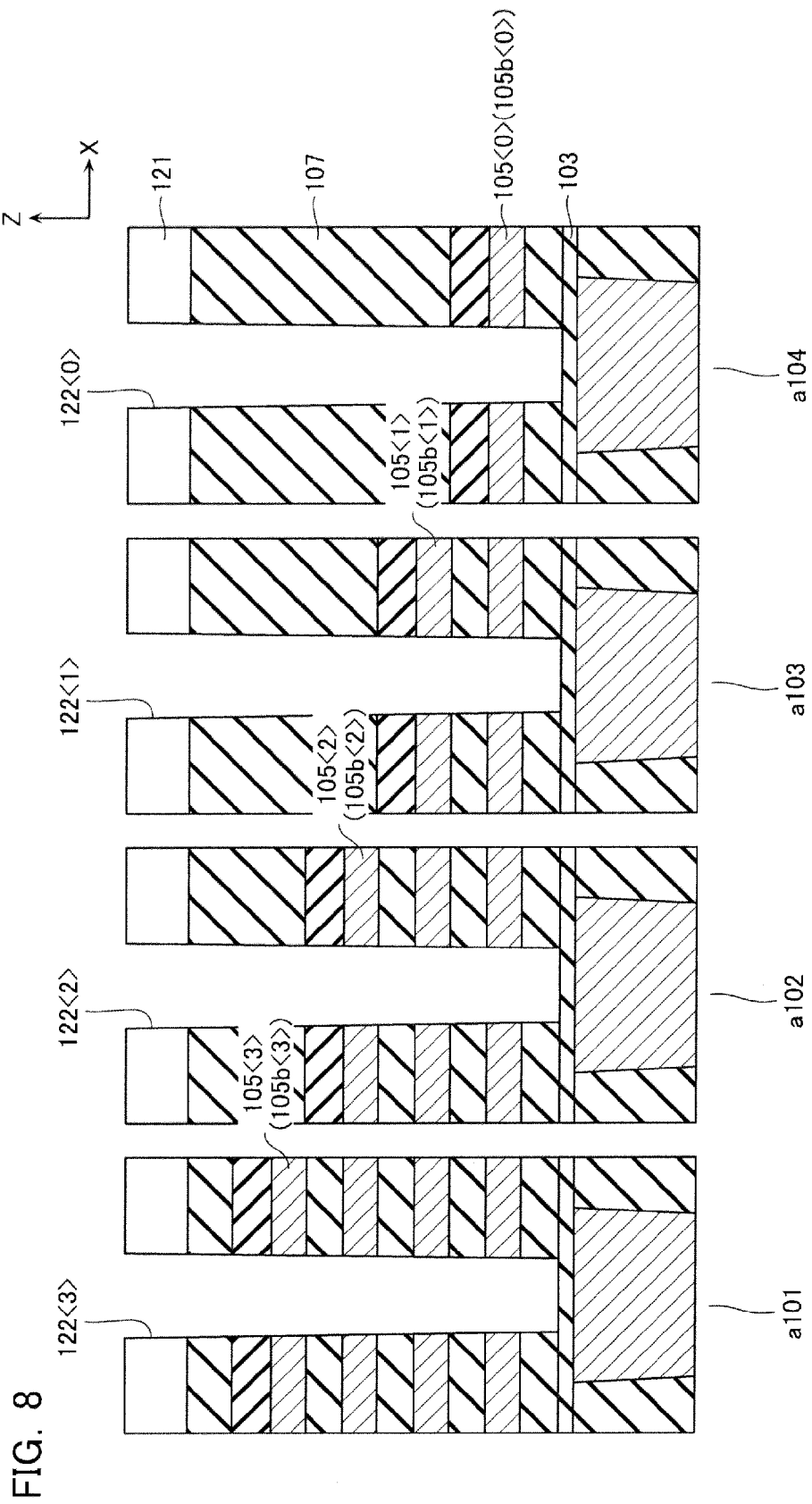

Next, as shown in FIG. 8, the hole 122<i> reaching from an inter-layer insulating film 107 upper surface to an upper surface of the etching stop film 103 is formed at a position of each of the contact portions 105b<i>, by anisotropic etching using the resist film 121.

Figure 9:
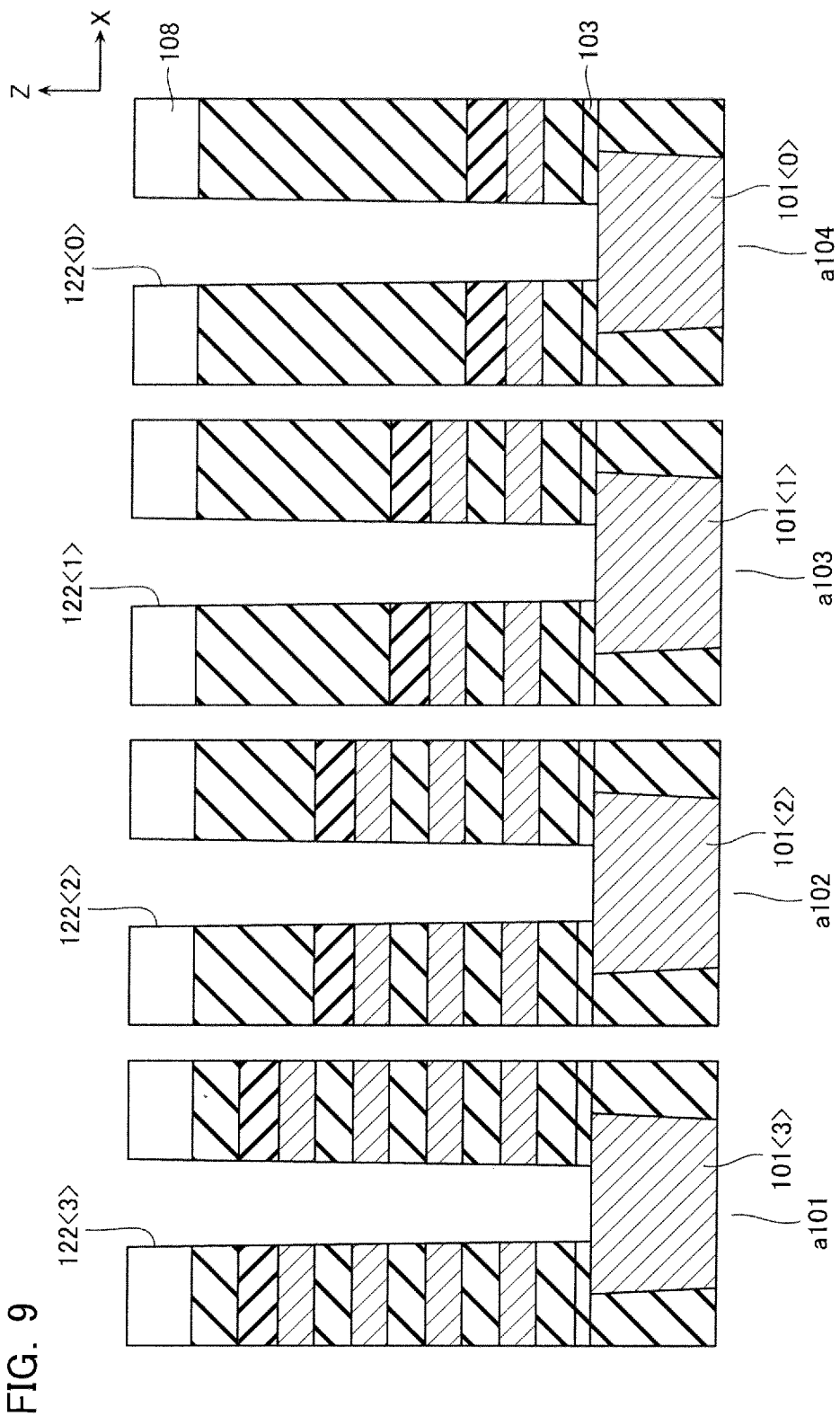

Next, as shown in FIG. 9, each of the holes 122<i> is continued to be dug out, by anisotropic etching using the resist film 121, until the etching stop film 103 is penetrated to expose an upper surface of the conductive film 101<i>. Note that a plurality of the holes 122 can be formed simultaneously during the steps shown in FIGS. 8 and 9.

Figure 10:
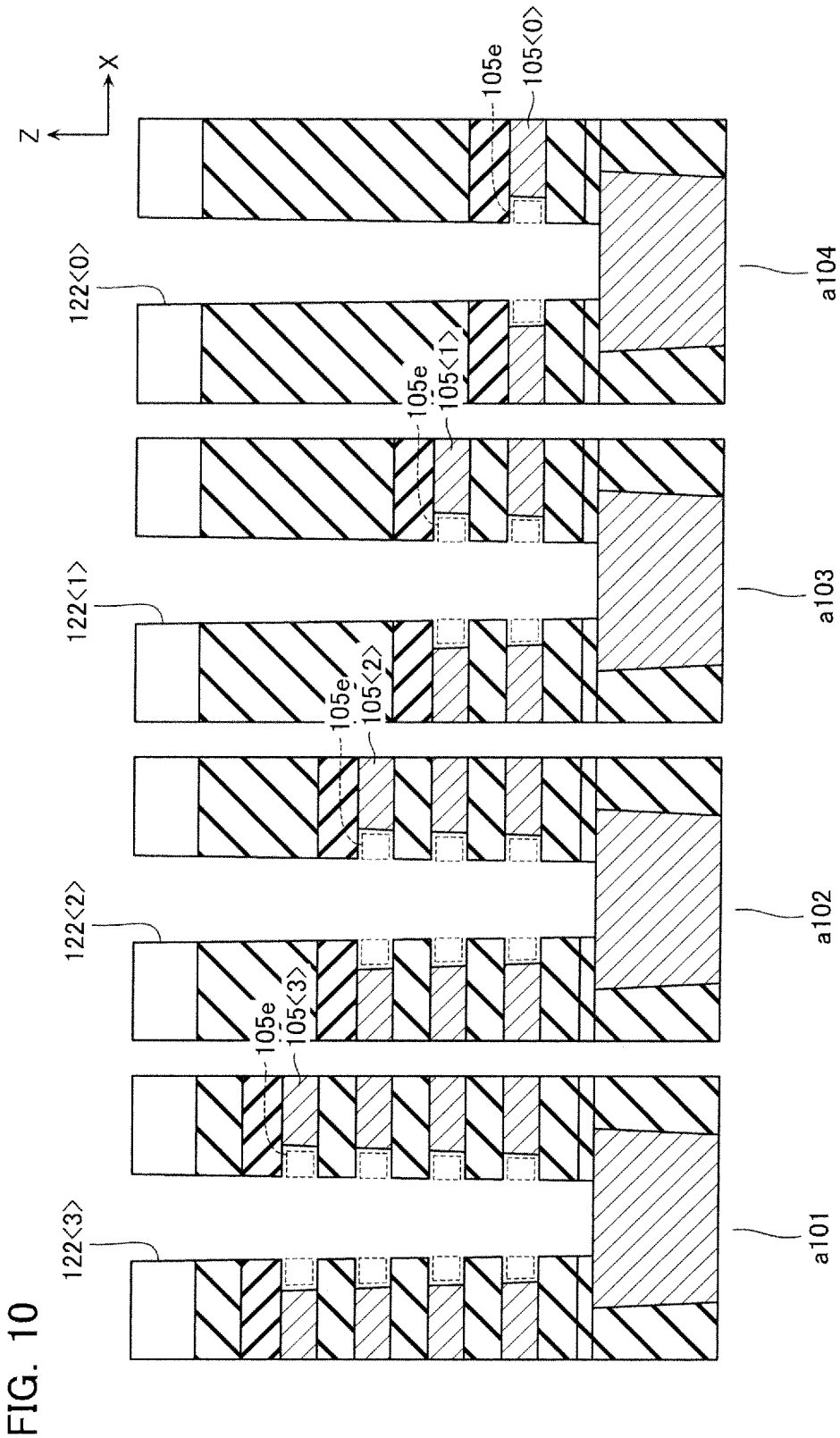

Next, as shown in FIG. 10, ends of the conductive films 105<0> to 105<i> exposed in a side surface of the hole 122<i> (places 105e shown by the broken lines of FIG. 10) are selectively removed by isotropic etching via the hole 122<i>.

Figure 11:
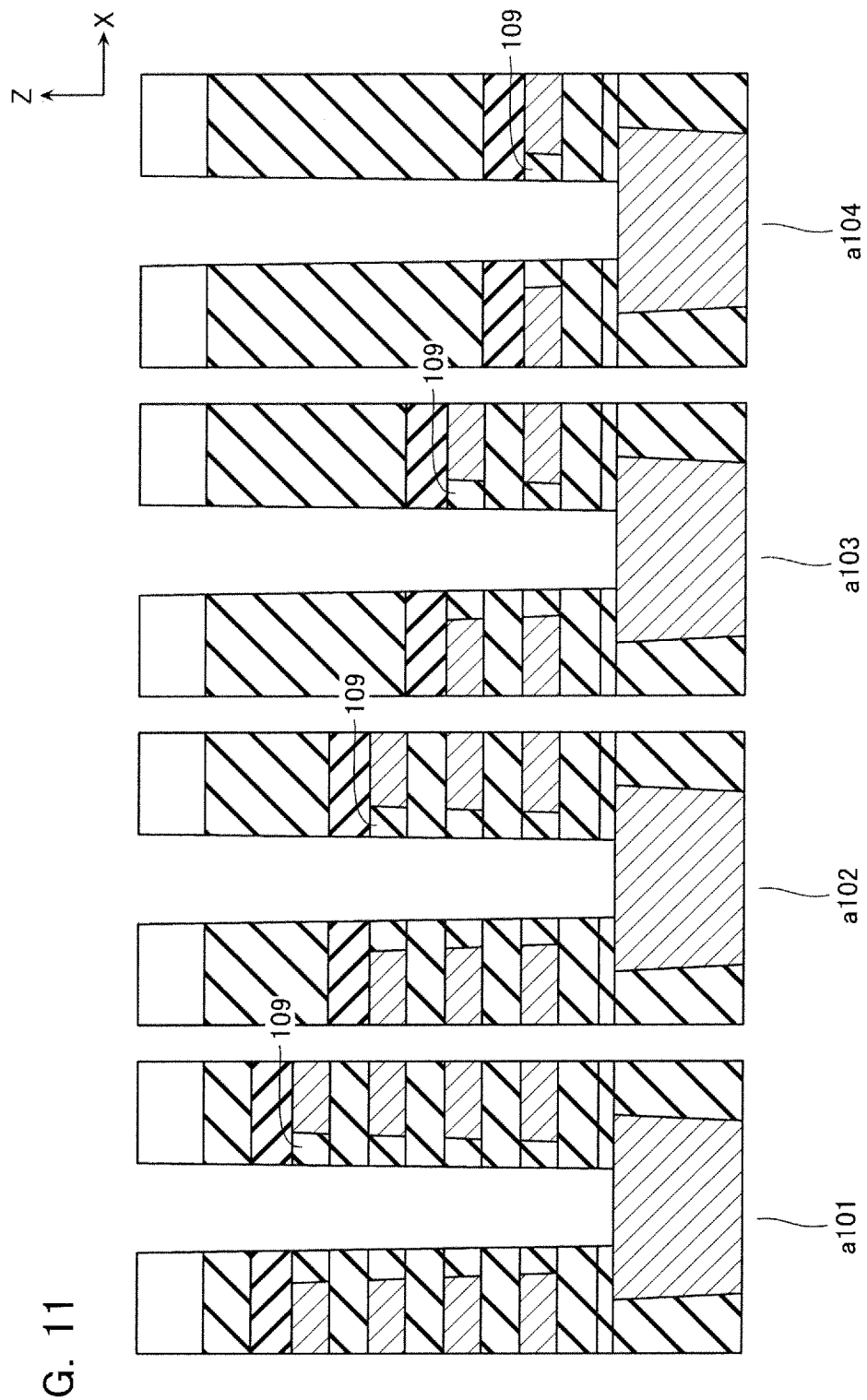

Next, the resist film 121 is removed, and then, as shown in FIG. 11, the insulating film 109 is implanted in the place 105e shown in FIG. 10. The insulating film 109 is formed by silicon oxide ($SiO_2$), for example.

Figure 12:
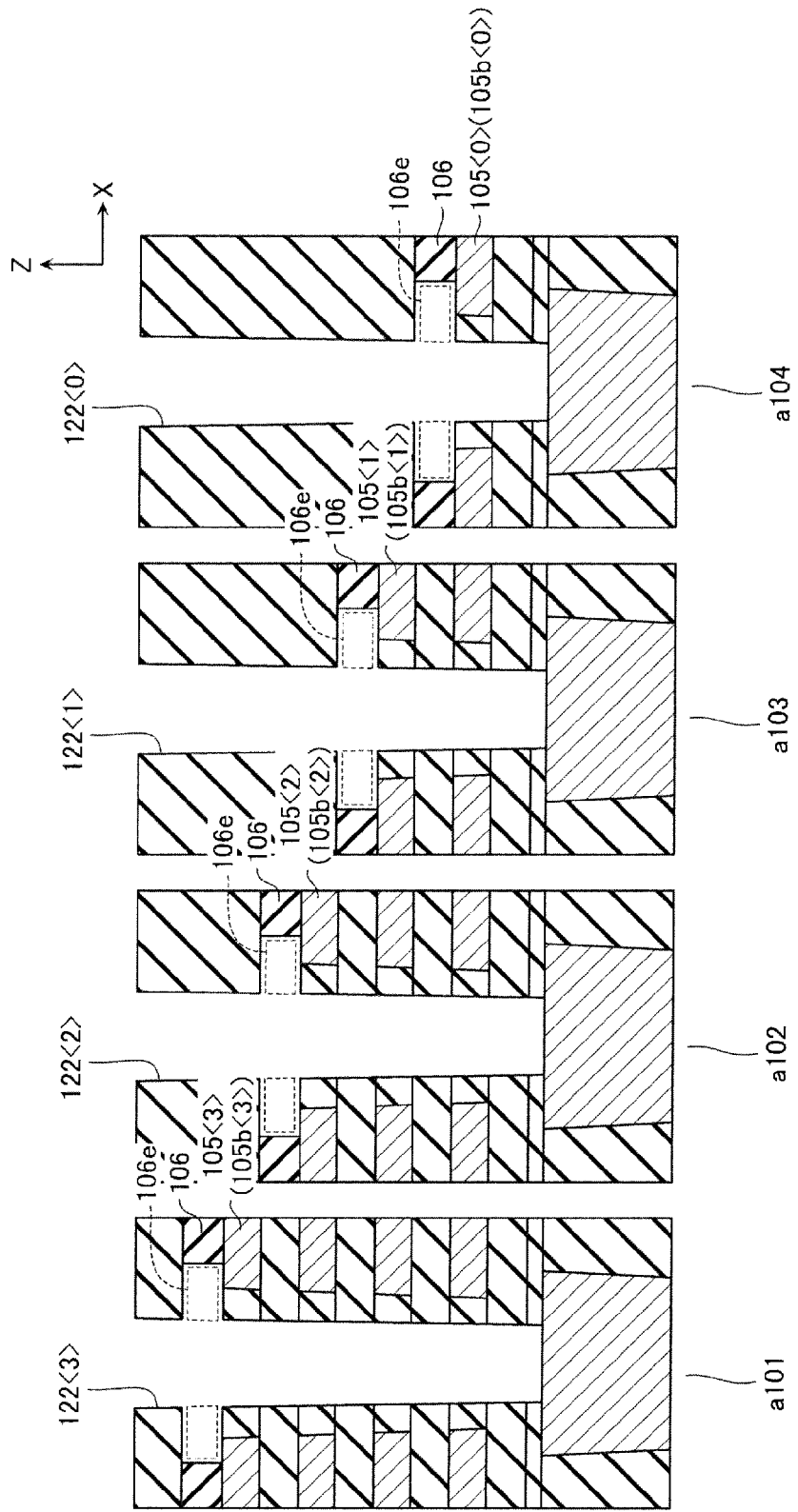

Next, as shown in FIG. 12, an end of the inter-layer insulating film 106 exposed in the side surface of the hole 122<i> is selectively removed, by isotropic etching via the hole 122<i>, until the upper surface of the uppermost layer conductive film 105<i> at each place is exposed. As a result, a place 106e for disposing the projecting part Z1b<i> of the via Z1<i> contacting the contact portion 105b<i> is formed in the side surface of the hole 122<i>.

Figure 13:
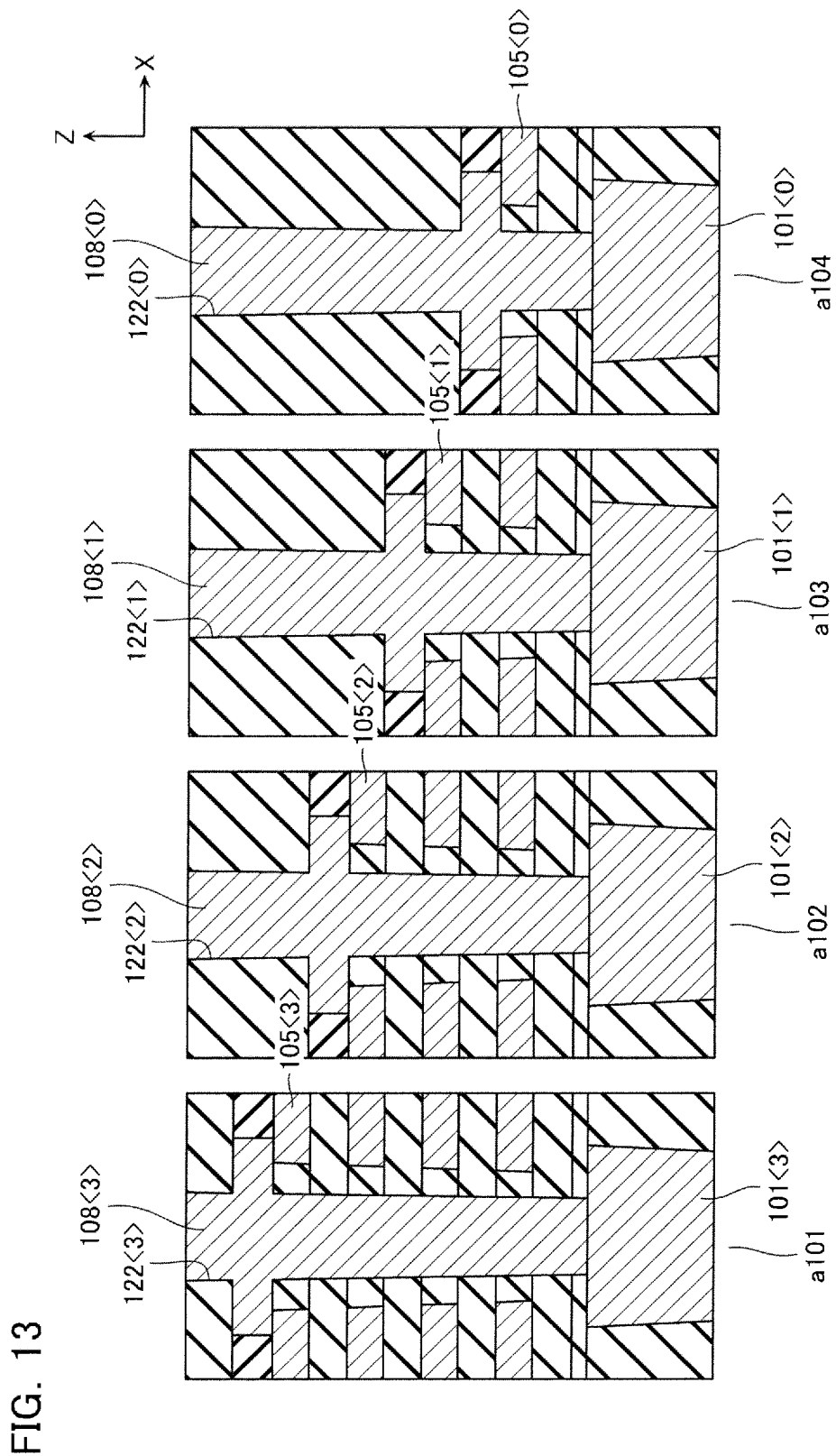

Finally, as shown in FIG. 13, a conductive film 108<i> is implanted in the hole 122<i>, and then an upper surface of the conductive film 108<i> is planarized by the likes of CMP (Chemical Mechanical Polishing). The conductive film 108<i> is formed by titanium nitride (TiN), for example, and functions as the via Z1<i>. As a result, as shown in FIG. 5, the via Z1<i> contacting the word line WL<i> and the via Z0<i>, is formed.

As a result of the above manufacturing steps, the connection structure of the contact region 1b of the memory cell array 1 shown in FIG. 5 is formed.

Next, advantages of the present embodiment will be described using a comparative example.

In a semiconductor device according to the comparative example employed herein, each of the word lines and the peripheral circuit are electrically connected by a first via (corresponding to the via Z1 of the present embodiment) that reaches from the word line to an upper layer wiring line, a second via that passes outside an arrangement region of the word line to reach from the upper layer wiring line to a third via (corresponding to the via Z0 of the present embodiment), and the third via that reaches from the second via to the peripheral circuit. Note that the first via does not have a portion corresponding to the projecting part Z1b of the present embodiment, and a bottom surface of the first via directly contacts an upper surface of the word line. In the case of the comparative example, interference between the word line of a lower layer and the via is avoided by once diverting a current path reaching from the word line to the peripheral circuit, to the upper layer wiring line.

In the case of this comparative example, three vias become necessary for every one word line. In particular, a space for disposing the second via becomes unnecessarily required for the contact region of the memory cell array, and this leads to an increase in chip size.

In this respect, in the case of the present embodiment, only the two vias Z1 and Z0 need be disposed for one word line WL, and when viewed from the Z direction, only a single via portion of arrangement region need be prepared. In other words, the present embodiment enables the space for via arrangement to be suppressed to half or less, compared to in the comparative example.

Moreover, in the case of the comparative example, as previously mentioned, the bottom surface of the first via and the upper surface of the word line are in direct contact, hence when forming a hole (corresponding to 122 of the present embodiment) for disposing the first via, a bottom surface of this hole must be matched to the upper surface of the word line. Now, when considering the case of forming a plurality of first vias contacting a plurality of word lines of different heights, the holes for disposing these first vias will each have a different depth. Therefore, if it is attempted to form these holes simultaneously, there is a risk that due to the influence of etching of a deeper hole, a shallower hole is over-etched. In a particularly severe case, it is also conceivable that the hole not only penetrates the word line desired to be brought into contact with the first via, but also ends up reaching the word line of a lower layer.

In this respect, in the case of the present embodiment, not only is it possible to align positions of the bottom surfaces of the vias Z1, but furthermore, there is a connection structure presupposing that each of the vias Z1<i> penetrates the word lines WL<0> to WL<i>. Therefore, even when the holes 122 are formed simultaneously, the risk of over-etching when forming holes of different depths as in the comparative example, can be eliminated.

As is clear from the above, the present embodiment makes is possible to provide: a semiconductor device that achieves a reduction in chip size by reducing space of a contact region and achieves a reduction in processing difficulty during via formation; and a method of manufacturing the same.

Second Embodiment

First, a connection structure of a memory cell array 1 and a peripheral circuit on a semiconductor substrate related to a second embodiment will be described exemplifying a connection structure of a word line WL and the peripheral circuit.

Figure 14:
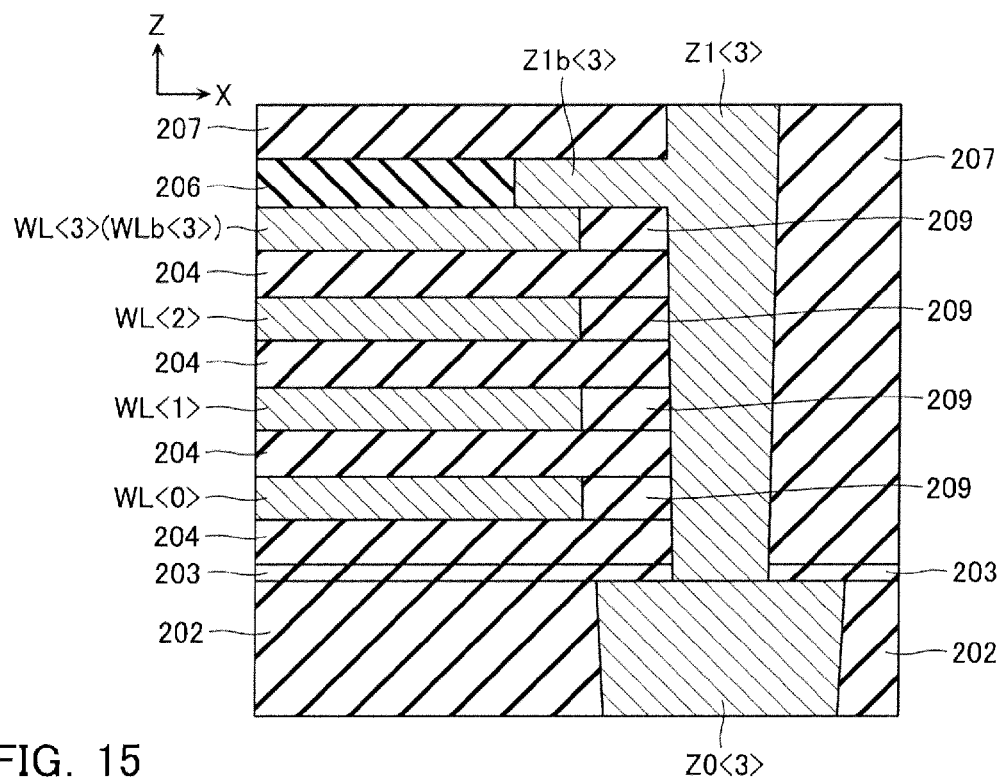
FIG. 14 is a cross-sectional view of a contact region of a memory cell array of a semiconductor device according to a second embodiment.

FIG. 14 is a cross-sectional view of a contact region of the memory cell array of a semiconductor device according to the present embodiment. FIG. 14 is a cross-sectional view of a via Z1<3> periphery.

A via Z1<i> of the present embodiment (i=0 to 3; in the case of FIG. 14, i=3) has a projecting part Z1b<i> formed only on one of side surfaces facing in the X direction, and contacts the word line WL<i> only on one side in the X direction.

In the case of the first embodiment, the projecting part Z1b<i> was formed so as to surround an entire periphery of the via Z1<i>, but contact with the word line WL<i> is possible even when the projecting part Z1b<i> is formed only on part of the periphery of the via Z1<i> as in the present embodiment. In other words, the present embodiment enables contact between the via Z1<i> and the word line WL<i>, similarly to in the first embodiment, even when the word line WL<i> has a contact portion WLb<i> of a shape not allowing the entire periphery of the via Z1<i> to be surrounded.

Next, manufacturing steps of a contact region 1b of the memory cell array 1 will be described.

FIGS. 15 to 18 are cross-sectional views describing the manufacturing steps of the contact region of the memory cell array of the semiconductor device according to the present embodiment.

Figure 15:
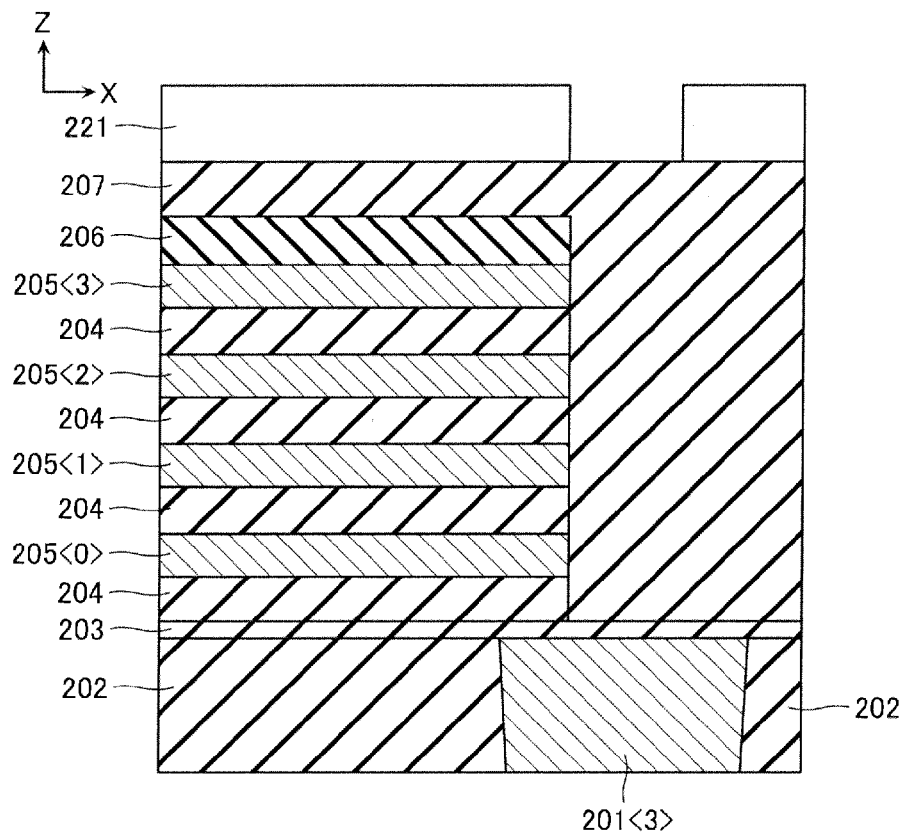
FIGS. 15 to 18 are cross-sectional views describing manufacturing steps of the contact region of the memory cell array of the semiconductor device according to the same embodiment.

First, a conductive film 201<i> (corresponding to 101 of FIG. 6) functioning as the via Z1<i> (i=0 to 3; in the case of FIGS. 15 to 18, i=3) and an inter-layer insulating film 202 (corresponding to 102 of FIG. 6) have a stacked body formed thereon, the stacked body being configured from: an etching stop film 203 (corresponding to 103 of FIG. 6); a plurality of inter-layer insulating films 204 (corresponding to 104 of FIG. 6); a plurality of conductive films 205 (corresponding to 105 of FIG. 6) functioning as a plurality of the word lines WL; and an inter-layer insulating film 206 (corresponding to 106 of FIG. 7). Now, the inter-layer insulating film 206 is formed by a material allowing an etching selectivity ratio to be taken with respect to materials of the inter-layer insulating film 204 and an inter-layer insulating film 207 (corresponding to 107 of FIG. 7) and insulating film 209 (corresponding to 109 of FIG. 11) formed in a later step. Next, ends of the inter-layer insulating film 204, the conductive film 205, and the inter-layer insulating film 206 are removed at a position of the conductive film 201<i>, and then the inter-layer insulating film 207 is deposited on the conductive film 201<i>, the inter-layer insulating film 202, and the inter-layer insulating film 206. Next, as shown in FIG. 15, a resist film 221 having a pattern of the via Z1<i> is deposited on the inter-layer insulating film 207.

Figure 16:
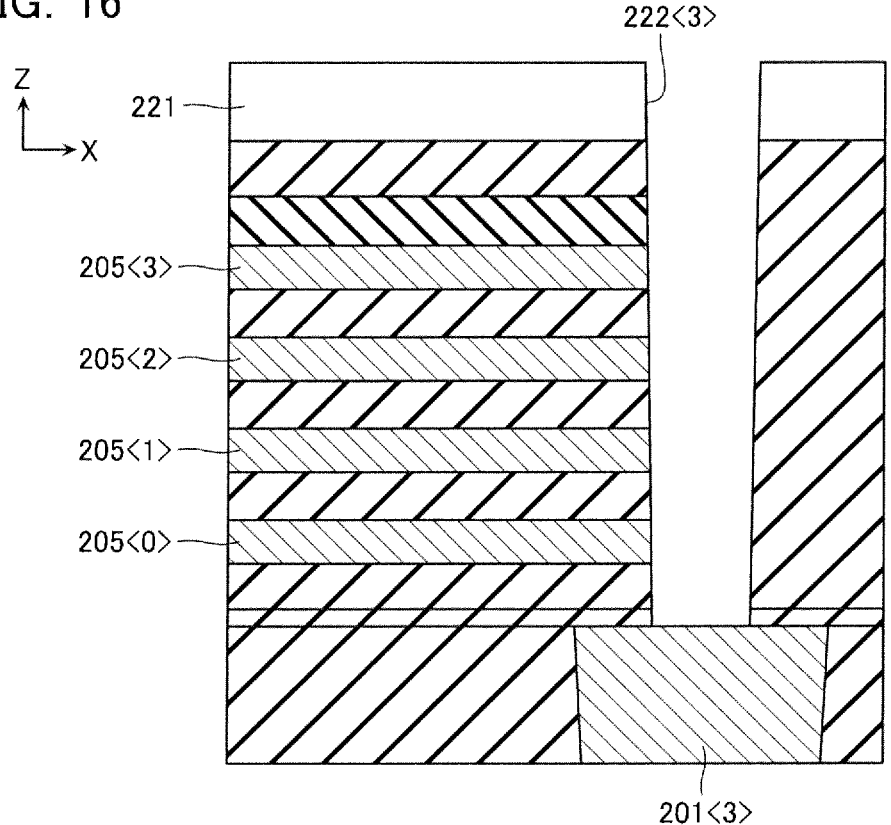

Next, as shown in FIG. 16, a hole 222<i> reaching from an upper surface of the inter-layer insulating film 206 to an upper surface of the conductive film 201<i> is formed at a position where the end of the conductive film 205 appears on a side surface, by anisotropic etching using the resist film 221.

Figure 17:
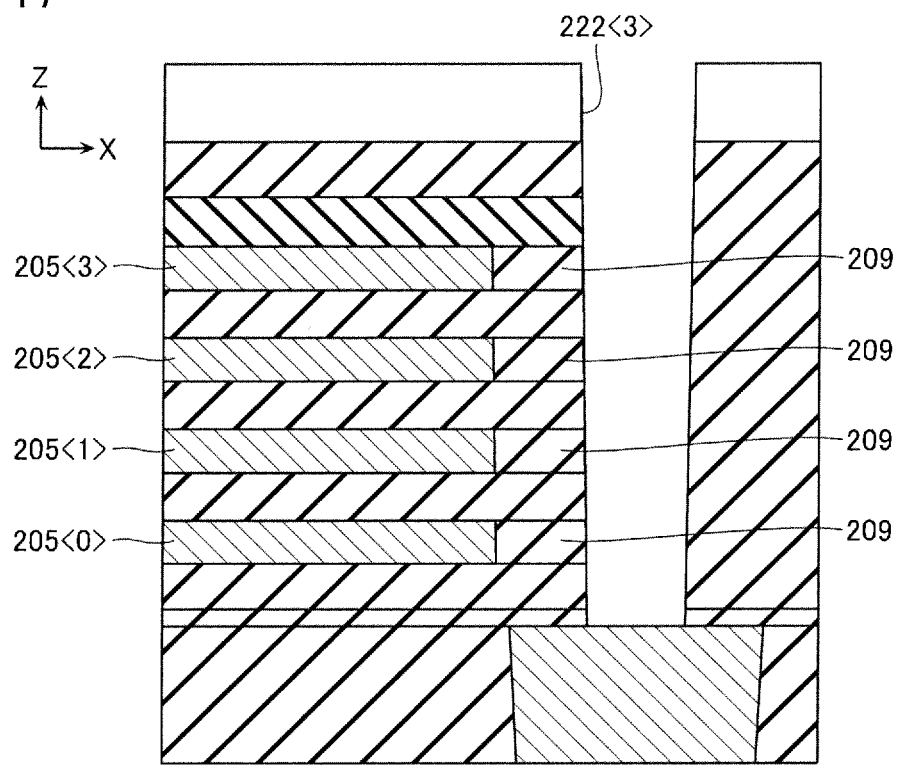

Next, ends of the conductive films 205<0> to 205<i> exposed in the side surface of the hole 222<i> are selectively removed by isotropic etching via the hole 222<i>. Next, as shown in FIG. 17, the insulating film 209 is implanted in said removed places.

Figure 18:
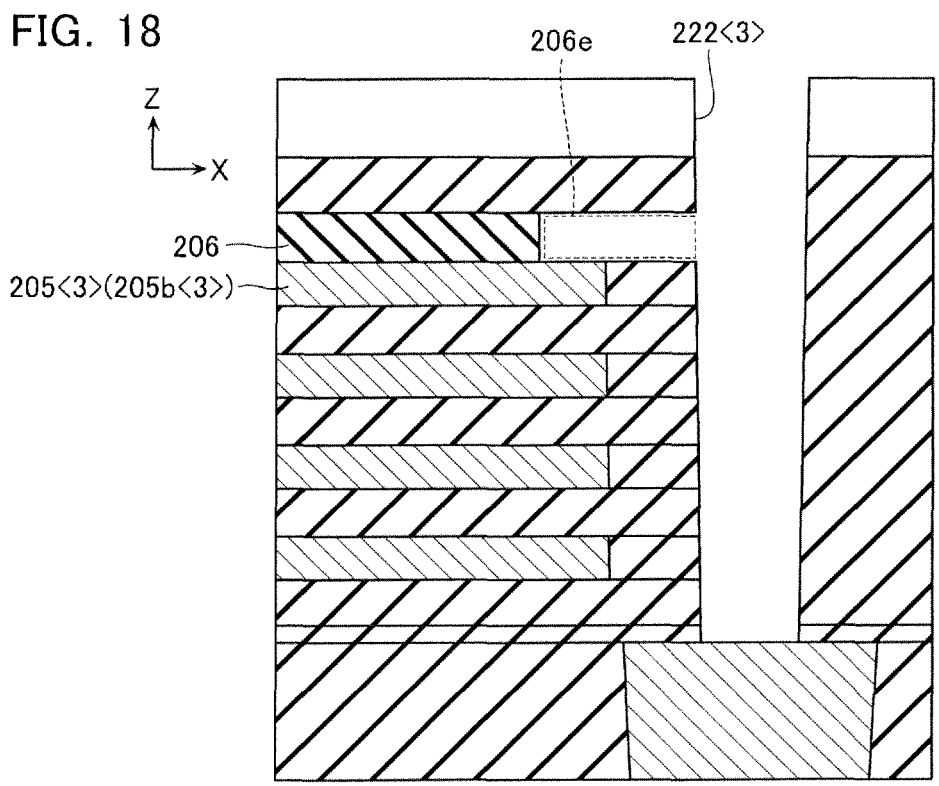

Next, as shown in FIG. 18, an end of the inter-layer insulating film 206 exposed in the side surface of the hole 222<i> is selectively removed, by isotropic etching via the hole 222<i>, until an upper surface of the conductive film 205<i> is exposed. As a result, a place 206e for disposing the projecting part Z1b<i> of the via Z1<i> contacting a contact portion 205b<i> is formed on one of side surfaces of the hole 222<i>.

Next, the resist film 221 is detached. Finally, a conductive film functioning as the via Z1<i> is implanted in the hole 222<i>, and then an upper surface of this conductive film is planarized by the likes of CMP. As a result, as shown in FIG. 14, the via Z1<i> contacting the word line WL<i> and the via Z0<i>, is formed.

As a result of the above manufacturing steps, the connection structure of the contact region 1b of the memory cell array 1 shown in FIG. 14 is formed.

As is clear from the above, the present embodiment also allows similar advantages to those of the first embodiment to be obtained even when contact is made with a wiring line of the memory cell array by part of the periphery of the via.

OTHERS

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor device, comprising:
a stacked body including a plurality of first conductive films stacked via an inter-layer insulating film;
a first conductive body facing the stacked body to extend in a stacking direction;
a plurality of first insulating films in the same layers as the first conductive films and disposed between the first conductive body and the first conductive films,
the first conductive body including a projecting part that projects along tops of one of the first insulating films and one of the first conductive films, and a lower surface of the projecting part contacting an upper surface of the one of the first conductive films; and a second insulating film configured from a material different from that of the first insulating film, disposed on the one of the first conductive films of the stacked body, and disposed in the same layer as the projecting part of the first conductive body.

2. The semiconductor device according to claim 1, further comprising:

a third insulating film configured from the same material as the first insulating film, and disposed in a more upper layer than the second insulating film and the projecting part.

3. The semiconductor device according to claim 1, further comprising:

a second conductive film extending in the stacking direction; and a plurality of memory cells disposed at intersections of the first conductive films and the second conductive film.

4. The semiconductor device according to claim 1, wherein the first conductive body contacts the first conductive film disposed in an uppermost layer at a certain position when viewed from the stacking direction.

5. The semiconductor device according to claim 1, further comprising a second conductive body disposed between a semiconductor substrate and the first conductive films in the stacking direction, wherein the first conductive body contacts an upper surface of the second conductive body at a bottom surface of the first conductive body.

6. The semiconductor device according to claim 1, further comprising a plurality of the first conductive bodies, wherein a certain first conductive body and another first conductive body contact a different first conductive film.

7. The semiconductor device according to claim 6, wherein the first conductive films are formed in a stepped shape in which an end of each first conductive film configures one step, and the first conductive bodies contact the ends of the first conductive films formed in the stepped shape.

8. The semiconductor device according to claim 6, wherein the first conductive bodies have a bottom surface in the same position in the stacking direction.

9. The semiconductor device according to claim 1, wherein the first conductive body has the projecting part on both side surfaces facing in a direction intersecting the stacking direction.

10. The semiconductor device according to claim 1, wherein the first conductive body has the projecting part only on one of side surfaces facing in a direction intersecting the stacking direction.

11. The semiconductor device according to claim 1, wherein the projecting part of the first conductive body contacts an upper surface of one of the first insulating films at a side surface facing in the stacking direction of the projecting part.

* * * * *